US008533567B2

(12) United States Patent
Sugawara

(10) Patent No.: US 8,533,567 B2
(45) Date of Patent: Sep. 10, 2013

(54) LOW DELAY AND AREA EFFICIENT SOFT ERROR CORRECTION IN ARBITRATION LOGIC

(75) Inventor: Yutaka Sugawara, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 398 days.

(21) Appl. No.: 12/852,801

(22) Filed: Aug. 9, 2010

(65) Prior Publication Data

US 2012/0036412 A1 Feb. 9, 2012

(51) Int. Cl.
*G06F 11/00* (2006.01)

(52) U.S. Cl.
USPC .......................................... 714/764; 714/758

(58) Field of Classification Search
USPC .................................. 714/758, 764
See application file for complete search history.

(56) References Cited

U.S. PATENT DOCUMENTS

| 6,199,124 | B1* | 3/2001 | Ramakrishnan et al. ....... 710/40 |
| 6,792,567 | B2 | 9/2004 | Laurent |
| 6,879,504 | B1* | 4/2005 | Lien et al. ..................... 365/49.1 |
| 6,948,113 | B1* | 9/2005 | Shaver ......................... 714/769 |
| 7,539,931 | B2 | 5/2009 | Thayer |
| 7,565,593 | B2* | 7/2009 | Dixon et al. .................. 714/754 |
| 7,644,311 | B2 | 1/2010 | Lien et al. |
| 7,676,728 | B2* | 3/2010 | Resnick et al. .............. 714/764 |
| 7,734,970 | B2* | 6/2010 | Drake et al. .................. 714/726 |
| 2009/0037781 | A1 | 2/2009 | Abella et al. |
| 2009/0085601 | A1 | 4/2009 | Nintunze et al. |
| 2009/0309627 | A1 | 12/2009 | Ranganathan et al. |

FOREIGN PATENT DOCUMENTS

JP 2005223668 A 8/2005

OTHER PUBLICATIONS

Fiedler, J., "Hamming Codes", 2004, http://orion.math.iastate.edu/linglong/Math690F04/HammingCodes.pdf.
Gao, J., "Reed Solomon Code," SUNY Stony Brook, Feb. 2007, http://www.cs.sunysb.edu/~jgao/CSE370-spring10/reed-solomon.pdf.
Oliveira, R., et al., "A TMR Scheme for SEU Mitigation in Scan Flip-Flops", 2007, 8th International Symposium on Quality Electronic Design (ISQED'07), IEEE, Computer Society.
Rao, T. R. N., "Use of Error Correcting Codes on Memory Words for Improved Reliability", Jun. 1968, IEEE Transactions on Reliability, pp. 91-96, vol. R-17, No. 2.
Nicolaidis, M., "Time Redundancy Based Soft-Error Tolerance to Rescue Nanometer Technologies", 1999, Proceedings of the 1999 17TH IEEE VLSI Test Symposium, pp. 86-94, IEEE Computer Society, Washington, DC.

(Continued)

*Primary Examiner* — Bryce Bonzo
*Assistant Examiner* — Elmira Mehrmanesh
(74) *Attorney, Agent, or Firm* — Scully, Scott, Murphy & Presser, P.C.; Daniel P. Morris, Esq.

(57) ABSTRACT

There is provided an arbitration logic device for controlling an access to a shared resource. The arbitration logic device comprises at least one storage element, a winner selection logic device, and an error detection logic device. The storage element stores a plurality of requestors' information. The winner selection logic device selects a winner requestor among the requestors based on the requestors' information received from a plurality of requestors. The winner selection logic device selects the winner requestor without checking whether there is the soft error in the winner requestor's information.

14 Claims, 4 Drawing Sheets

(56) References Cited

OTHER PUBLICATIONS

Wang, N. J., et al., "ReStore: Symptom-Based Soft Error Detection in Microprocessors", Jul.-Sep. 2006, IEEE Trans. Dependable and Secure Computing, pp. 188-201, vol. 3, No. 3.

Wilson, R. A., "The Golay code," Jan. 2008, QMUL, Pure Mathematics Seminar.

Conway, J. H., et al. "Self-Dual Codes over the Integers Modulo 4," 1993, J. Combinational Theory, Series A., vol. 62, pp. 30-45.

Dhillon, Y. S., et al., "Load and Logic Co-Optimization for Design of Soft-Error Resistant Nanometer CMOS Circuits" 2005, Proceedings of the 11th IEEE International On-Line Testing Symposium, pp. 35-40, IEEE Computer Society Washington, DC.

Karnik, T., et al., "Characterization of Soft Errors Caused by Single Event Upsets in CMOS Processes", Apr.-Jun. 2004, IEEE Transactions on Dependable and Secure Computing, pp. 128-143, vol. 1, No. 2.

Novac, O., et al., "Implementation of a Sec-ded Code with FPGA Xilinx Circuits to the Cache Level of a Memory Hierarchy," 2008, http://electroinf.uoradea.ro/reviste%20CSCS/documente/JCSCS_2008/JCSCS_2008_12_Novac_1.pdf.

Raaphorst, S., "Reed-Muller Codes," Carleton University, May 2003.

Langton, C., "Tutorial 12 Coding and decoding with Convolutional Codes," Jul. 1999, www.complextoreal.com.

Hamming, R. W., "Error Detecting and Error Correcting Codes", The Bell System Technical Journal, Apr. 1950, pp. 147-160, vol. XXVI, No. 2.

Wallace, H., "Error Detection and Correction Using the BCH Code," 2001, Atlantic Quality Design, Inc., http://www.aqdi.com/bch.pdf.

Ruan, S., et al., "Soft Error Hardened FF Capable of Detecting Wide Error Pulse", Proc. 2008 IEEE International Symposium on Defect and Fault Tolerance of VLSI Systems, pp. 272-280.

* cited by examiner

LOW DELAY AND AREA EFFICIENT SOFT ERROR CORRECTION IN ARBITRATION LOGIC

GOVERNMENT CONTRACT

This invention was Government support under Contract No. B554331 awarded by Department of Energy. The Government has certain rights in this invention.

CROSS-REFERENCE TO RELATED APPLICATIONS

The present invention is related to the following commonly-owned, co-pending United States Patent Applications, the entire contents and disclosure of each of which is expressly incorporated by reference herein as if fully set forth herein: U.S. patent application Ser. No. 12/684,367, filed Jan. 8, 2010, for "USING DMA FOR COPYING PERFORMANCE COUNTER DATA TO MEMORY"; U.S. patent application Ser. No. 12/684,172, filed Jan. 8, 2010 for "HARDWARE SUPPORT FOR COLLECTING PERFORMANCE COUNTERS DIRECTLY TO MEMORY"; U.S. patent application Ser. No. 12/684,190, filed Jan. 8, 2010 for "HARDWARE ENABLED PERFORMANCE COUNTERS WITH SUPPORT FOR OPERATING SYSTEM CONTEXT SWITCHING"; U.S. patent application Ser. No. 12/684,496, filed Jan. 8, 2010 for "HARDWARE SUPPORT FOR SOFTWARE CONTROLLED FAST RECONFIGURATION OF PERFORMANCE COUNTERS"; U.S. patent application Ser. No. 12/684,429, filed Jan. 8, 2010, for "HARDWARE SUPPORT FOR SOFTWARE CONTROLLED FAST MULTIPLEXING OF PERFORMANCE COUNTERS"; U.S. patent application Ser. No. 12/697,799, for "CONDITIONAL LOAD AND STORE IN A SHARED CACHE"; U.S. patent application Ser. No. 12/684,738, filed Jan. 8, 2010, for "DISTRIBUTED PERFORMANCE COUNTERS"; 61/261,269, filed Nov. 13, 2009 for "LOCAL ROLLBACK FOR FAULT-TOLERANCE IN PARALLEL COMPUTING SYSTEMS"; U.S. patent application Ser. No. 12/684,860, filed Jan. 8, 2010, for "PAUSE PROCESSOR HARDWARE THREAD ON PIN"; U.S. patent application Ser. No. 12/684,174, filed Jan. 8, 2010, for "PRECAST THERMAL INTERFACE ADHESIVE FOR EASY AND REPEATED, SEPARATION AND REMATING"; U.S. patent application Ser. No. 12/684,184, filed Jan. 8, 2010, for "ZONE ROUTING IN A TORUS NETWORK"; U.S. patent application Ser. No. 12/684,852, filed Jan. 8, 2010, for "PROCESSOR RESUME UNIT"; U.S. patent application Ser. No. 12/684,642, filed Jan. 8, 2010, for "TLB EXCLUSION RANGE"; U.S. patent application Ser. No. 12/684,804, filed Jan. 8, 2010, for "DISTRIBUTED TRACE USING CENTRAL PERFORMANCE COUNTER MEMORY"; U.S. patent application Ser. No. 61/295,669, filed Jan. 15, 2010, for "PARTIAL CACHE LINE SPECULATION SUPPORT"; U.S. patent application Ser. No. 61/293,237, filed Jan. 8, 2010, for "ORDERING OF GUARDED AND UNGUARDED STORES FOR NO-SYNC I/O"; U.S. patent application Ser. No. 12/693,972, filed Jan. 26, 2010, for "DISTRIBUTED PARALLEL MESSAGING FOR MULTIPROCESSOR SYSTEMS"; U.S. patent application Ser. No. 12/688,747, filed Jan. 15, 2010, for "Support for non-locking parallel reception of packets belonging to the same reception FIFO"; U.S. patent application Ser. No. 12/688,773, filed Jan. 15, 2010, for "OPCODE COUNTING FOR PERFORMANCE MEASUREMENT"; 61/293,611, filed Jan. 8, 2010 for "A MULTI-PETASCALE HIGHLY EFFICIENT PARALLEL SUPERCOMPUTER"; U.S. patent application Ser. No. 12/984,252, filed Jan. 4, 2011, "CACHE WITHIN A CACHE"; U.S. patent application Ser. No. 13/008,502, for "MEMORY SPECULATION IN A MULTI LEVEL CACHE SYSTEM"; U.S. patent application Ser. No. 13/008,583, for "READER SET ENCODING FOR DIRECTORY OF SHARED CACHE MEMORY IN MULTIPROCESSOR SYSTEM"; U.S. patent application Ser. No. 12/984,308, for "MINIMAL FIRST LEVEL CACHE SUPPORT FOR MEMORY SPECULATION MANAGED BY LOWER LEVEL CACHE"; U.S. patent application Ser. No. 12/984,329, for "PHYSICAL ADDRESS ALIASING TO SUPPORT MULTI-VERSIONING IN A SPECULATION-UNAWARE CACHE"; U.S. patent application Ser. No. 61/293,552, filed Jan. 8, 2010, for "LIST BASED PREFETCH"; U.S. patent application Ser. No. 12/684,693, filed Jan. 8, 2010, for "PROGRAMMABLE STREAM PREFETCH WITH RESOURCE OPTIMIZATION"; U.S. patent application Ser. No. 61/293,494, filed Jan. 8, 2010, for "FLASH MEMORY FOR CHECKPOINT STORAGE"; U.S. patent application Ser. No. 61/293,476, filed Jan. 8, 2010, for "NETWORK SUPPORT FOR SYSTEM INITIATED CHECKPOINTS"; U.S. patent application Ser. No. 61/293,554, filed Jan. 8, 2010, for "TWO DIFFERENT PREFETCHING COMPLEMENTARY ENGINES OPERATING SIMULTANEOUSLY"; U.S. patent application Ser. No. 12/697,015, for "DEADLOCK-FREE CLASS ROUTES FOR COLLECTIVE COMMUNICATIONS EMBEDDED IN A MULTI-DIMENSIONAL TORUS NETWORK"; U.S. patent application Ser. No. 61/293,559, filed Jan. 8, 2010, for "IMPROVING RELIABILITY AND PERFORMANCE OF A SYSTEM-ON-A-CHIP BY PREDICTIVE WEAR-OUT BASED ACTIVATION OF FUNCTIONAL COMPONENTS"; U.S. patent application Ser. No. 61/293,569, filed Jan. 8, 2010, for "IMPROVING THE EFFICIENCY OF STATIC CORE TURNOFF IN A SYSTEM-ON-A-CHIP WITH VARIATION"; U.S. patent application Ser. No. 12/697,043, for "IMPLEMENTING ASYNCHRONOUS COLLECTIVE OPERATIONS IN A MULTI-NODE PROCESSING SYSTEM"; U.S. patent application Ser. No. 13/008,546, for "MULTIFUNCTIONING CACHE"; U.S. patent application Ser. No. 12/697,175 for "I/O ROUTING IN A MULTIDIMENSIONAL TORUS NETWORK"; U.S. patent application Ser. No. 12/684,287, filed Jan. 8, 2010 for "ARBITRATION IN CROSSBAR INTERCONNECT FOR LOW LATENCY"; U.S. patent application Ser. No. 12/684,630, filed Jan. 8, 2010 for "EAGER PROTOCOL ON A CACHE PIPELINE DATAFLOW"; U.S. patent application Ser. No. 12/723,277 for "EMBEDDING GLOBAL BARRIER AND COLLECTIVE IN A TORUS NETWORK"; U.S. patent application Ser. No. 61/293,499, filed Jan. 8, 2010 for "GLOBAL SYNCHRONIZATION OF PARALLEL PROCESSORS USING CLOCK PULSE WIDTH MODULATION"; U.S. patent application Ser. No. 61/293,266, filed Jan. 8, 2010 for "IMPLEMENTATION OF MSYNC"; U.S. patent application Ser. No. 12/796,389 for "NON-STANDARD FLAVORS OF MSYNC"; U.S. patent application Ser. No. 12/696,817 for "HEAP/STACK GUARD PAGES USING A WAKEUP UNIT"; U.S. patent application Ser. No. 61/293,603, filed Jan. 8, 2010 for "MECHANISM OF SUPPORTING SUB-COMMUNICATOR COLLECTIVES WITH O(64) COUNTERS AS OPPOSED TO ONE COUNTER FOR EACH SUB-COMMUNICATOR"; and U.S. patent application Ser. No. 12/774,475 for "REPRODUCIBILITY IN A MULTIPROCESSOR SYSTEM".

BACKGROUND

The present application generally relates to arbitrating a shared resource in a computing environment. More particularly, the present application relates to detecting and/or correcting soft error(s) in an arbitration logic device in a digital circuit while the arbitration logic device continues to work correctly under the soft error(s).

In a digital circuit, it is common that multiple modules compete for a single shared resource (e.g. bus, cache memory, etc.). Thus, an arbitration logic device is often used to resolve shared resource conflicts. An arbitration logic device selects one of a winner requestor among the multiple requestors (i.e., the competing multiple modules). Then, the winning requestor accesses the shared resource. In very large scale integrated (VLSI) circuits, a large number of requestors are subject to competing each other. For example, there are hundreds or even thousands of candidate requestors for such competition.

An arbitration logic device memorizes the state of each requestor (e.g. whether each requestor has a pending request), e.g., by storing the state of each requestor in storage elements, e.g., latches, registers, flip-flops, etc. However, these storage elements can flip their values due to soft errors. Soft error refers to an error on data stored in a computing system that does not damage hardware of the computing system but corrupts the data. Because of a trend of high-density and low-power consumption in semiconductor designing/manufacturing technology (e.g., 20-nm CMOS technology), a soft error may occur more frequently in recent VLSI circuits. A soft error occurs not only in a memory device (e.g., SRAM, DRAM, SDRAM, etc.), but also in a register, for example, in a processor (core). Therefore, a soft error becomes more significant problem as the digital circuits are designed based on nanotechnology (e.g., 30-nm CMOS technology).

Traditionally, a duplication method has been used to detect and correct soft errors in a digital circuit. Duplication method uses multiple instances of storage elements to store same data. Using two copies of data, it is possible for the digital circuit to detect a single bit error. For example, if the two copies have different values, there exists a soft error on the data. Similarly, using three copies of data, the digital circuit can correct a single bit error, e.g., considering two copies that store same data as valid copies. Although this duplication method is simple and easy to implement, it increases the number of storage elements in the digital circuits unacceptably in terms of hardware size and power consumption.

ECC (Error Correcting Code) has also been a popular method to correct soft errors in digital circuits. Adding a small number of extra information (e.g., additional 10% data) to original information, hardware logic implementing an ECC scheme (e.g., multiple parity bits) can correct soft errors as long as the number of flipped bits is small enough (e.g., the number of bits being corrupted is one).

Protecting memory cells (i.e., cells in a memory device) using ECC is widely used in current digital systems. However, a naïve ECC method is not efficient for the arbitration logic device. For example, because the arbitration logic device needs to know the states of all the requestors, the arbitration logic device looks up all the memorized information at once. Therefore, all the memorized information has to be corrected at the same time. As a result, significant amount of ECC correction logic device is necessary: traditionally, one ECC correction logic device is required per one ECC word. The number of ECC correction logic devices increases as the number of ECC words increases. However, this increase becomes not acceptable both in hardware size and in power consumption as digital circuits become dense and operate in a low-power environment (e.g., $V_{dd}$=1.6V). Furthermore, an ECC correction delay (i.e., the time that an ECC correction logic device takes to fix a soft error) is added to the critical path in the arbitration logic device, thus increasing latency for the arbitration. A critical path in a digital circuit refers to a path that takes the longest time to operate in the digital circuit.

There have been other methods proposed to solve soft errors that include, but are not limited to: 1. Exploiting time redundancy to tolerate soft errors, 2. Using a known Delay-Assignment-Variation (DAV) methodology to mitigate soft errors, 3. Optimizing internal structures of latches to make them tolerant to soft errors, etc. Though these methods have some effect on reducing the impact of soft errors, they depend on semiconductor devices or development tools. Thus, they are lack of generality because these proposed methods rely on semiconductor device technologies (e.g., 40 nm CMOS technology) and synthesis tools (e.g., synthesis tools from Cadence®, etc.) through which these method are implemented on semiconductor devices. Sometimes, they are difficult or even impossible to be implemented.

There has been a method for fixing soft errors at a system level. For example, there is a method for microprocessors to recover from soft errors by an additional system-level logic or process for soft error handling, e.g., adding check points. However, depending on a design of a digital circuit, it may not be easy to add such mechanism in the digital circuit.

SUMMARY OF THE INVENTION

The present disclosure describes a method and computer program product for operating an arbitration logic device that controls a shared resource. The present disclosure also describes the arbitration logic device that detects and/or corrects soft error(s) after speculatively computing an arbitration result.

In one embodiment, there is provided an arbitration logic device for controlling an access to a shared resource. The arbitration logic device comprises at least one storage element, a winner selection logic device, and an error detection logic device. The storage element stores a plurality of requestors' information received from a plurality of requestors. The winner selection logic device selects a winner requestor among the requestors based on the requestors' information. The winner selection logic device selects the winner requestor without checking whether there is the soft error in the winner requestor's information.

In a further embodiment, the arbitration logic device includes a result cancellation logic device and an error detection logic device. The result cancellation logic device cancels the selection of the winner requestor in response to determining that there is the soft error on the winner's requestor's information. The error detection logic device detects a soft error on the winner requestor's information.

In a further embodiment, the error detection logic device resides outside of a critical path in the arbitration logic device.

In a further embodiment, the requestors' information is encoded with an error correcting code (ECC) that includes one or more of: Hamming code, Golay code, Reed-Muller code, BCH (Bose and Ray-Chaudhuri) code, Reed-Solomon code, self-dual code, convolutional code, SEC-DED code.

BRIEF DESCRIPTION OF THE DRAWINGS

The accompanying drawings are included to provide a further understanding of the present invention, and are incorporated in and constitute a part of this specification.

DETAILED DESCRIPTION

Figure 1:
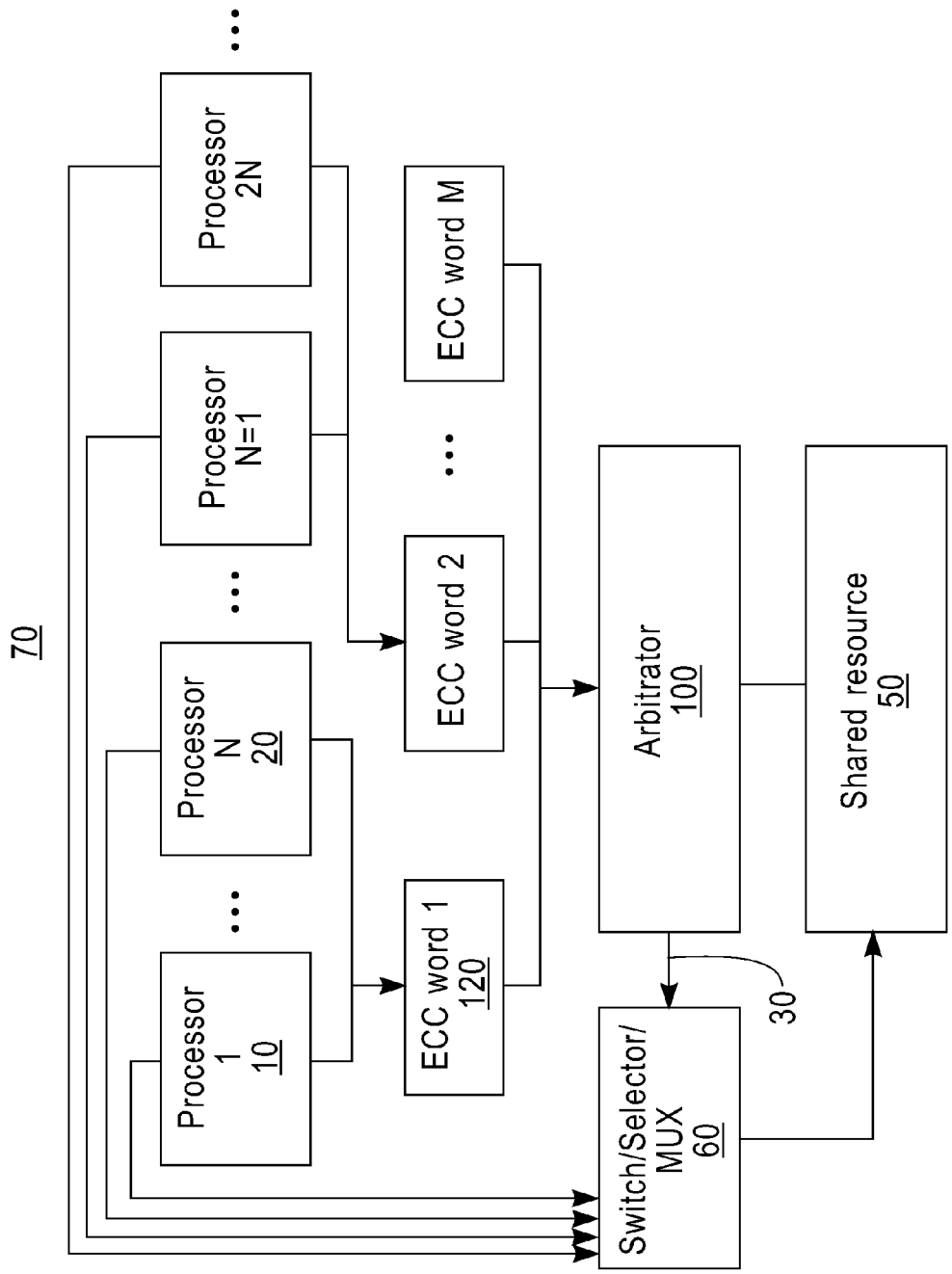
FIG. 1 illustrates a computing environment where arbitration logic can be employed in one embodiment.

In one embodiment, FIG. 1 illustrates a computing environment 70 where an arbitration logic device can be employed in one embodiment. This computing environment 70 includes, but is not limited to: a plurality of processors (e.g., processor 1 (10), processor N (20), etc.), a switching device 60, a shared resource 50 (e.g., a shared memory device, a shared bus, etc.). To access the shared resource 50, a requestor (e.g., a processor, etc.) which wants to access the shared resource issues an (access) request including requestor status information to the arbitration logic device 100. In one embodiment, multiple requests are combined into an ECC word. In other words, "N" piece of requestor status information is combined to form an ECC word. For example, an ECC word 1 (120) includes, but is not limited to: status information of processor 1 (10), status information of processor 2 (not shown), status information of processor 3 (not shown), status information of processor N (20), and ECC code (e.g., ECC code 110 in FIG. 2) computed based on data corresponding to these status information.

Requestor status information includes, but is not limited to: one or more bits representing a requestor ID associated with a particular requestor, one or more bits indicating whether the particular requestor has a pending request to a shared resource controlled by the arbitration logic device 100, one or more bits indicating when the particular resource issued the pending request, one or more bits indicating how many requests the particular requestor issued so far or within a pre-determined time period, one or more bits indicating the number of total pending requests, one or more bits indicating how many requestors are waiting an access to the shared resource 50, etc.

Figure 4:
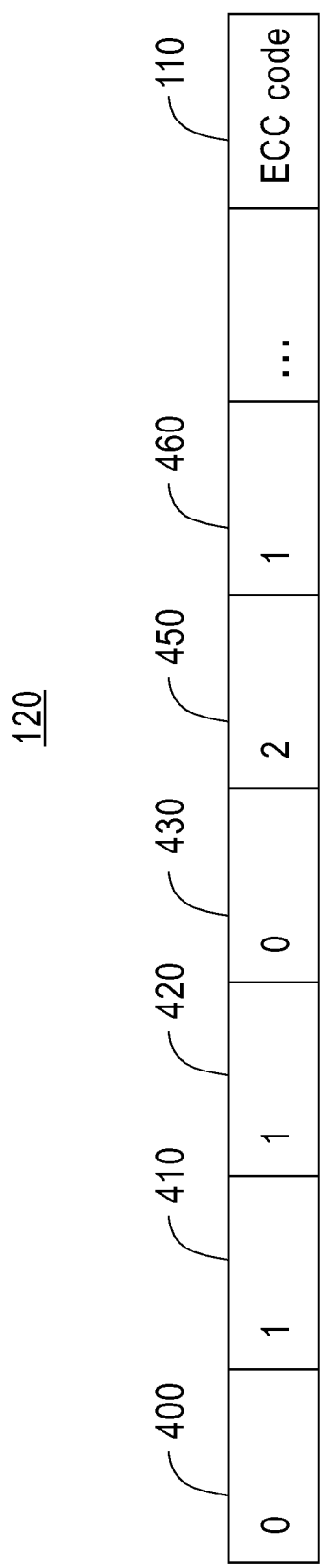
FIG. 4 illustrates exemplary requestor status information in one embodiment.

FIG. 4 illustrates an exemplary ECC word 120 including status information of "N" number of processors. In FIG. 4, for example, the first bit field "0" (400) corresponds to the requestor ID of the processor 1. (A bit field includes one or more bits.) The second bit field (410) corresponds to a bit representing whether the processor 1 wants to access the shared resource 50. For example, "1" in the second bit field (410) represents that the processor 1 wants to accesses the shared resource 50. The third bit field (420) represents the requestor ID of the processor 2. The fourth bit field (430) corresponds to a bit representing whether the processor 2 wants to access the shared resource 50. For example, "0" in the fourth bit field (430) represents that the processor 2 does not want to accesses the shared resource 50 at this time. The fifth bit field (450) represents the requestor ID of the processor 3. The sixth bit field (460) corresponds to a bit representing whether the processor 3 wants to access the shared resource 50. For example, "1" in the sixth bit field (460) represents that the processor 3 wants to accesses the shared resource 50. Similarly, the ECC word 120 includes bits to represent each requestor ID and whether each processor wants to access the shared resource 50. The ECC word 120 also includes ECC code 110 that is used to correct a potential soft error in the ECC word 120.

Returning to FIG. 1, the arbitration logic device 100 receives M number of ECC words, and selects a winner requestor 30. For example, the arbitration logic device 100 may select one requestor among requestors whose status information indicate that these requestors want to access the shared resource, e.g., randomly, by seniority, etc. In one embodiment, the arbitration logic device 100 sends one or more bits 30 that represent the selected winner requestor to the switching device 60. The switching device 60, which may be implemented by a selector, multiplexor or other equivalent device, allows the winner requestor (e.g., a winner processor) to access the shared resource 50.

Figure 2:
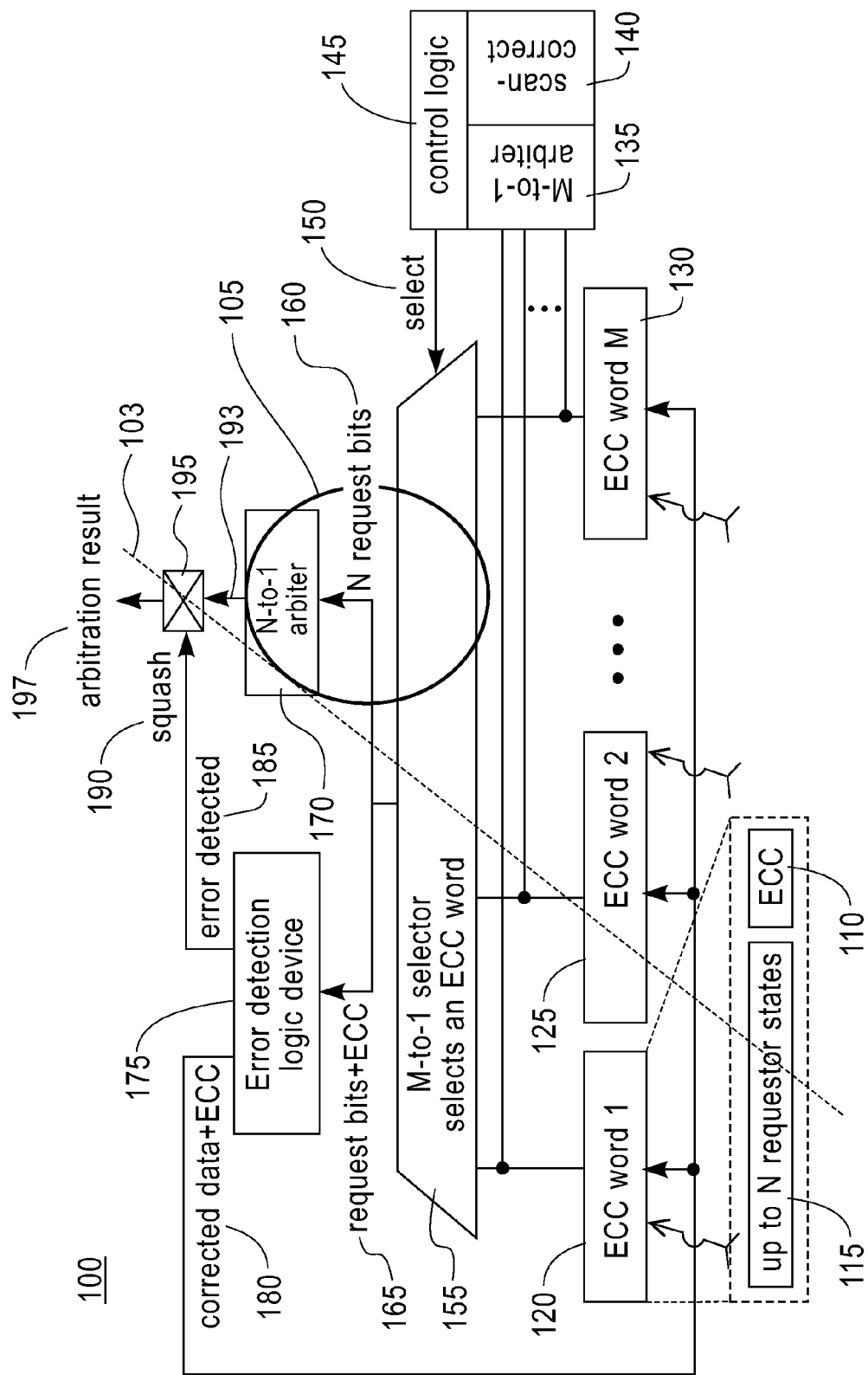
FIG. 2 illustrates a system diagram of an arbitration logic device in one embodiment.

FIG. 2 illustrates in detail the arbitration logic device 100, in one embodiment, that can store at least one ECC (Error Correcting Code) to protect requestor state information from soft errors, and that can recover from soft errors in the requestor status information. ECC includes, but is not limited to: Hamming code, Golay code, Reed-Muller code, BCH (Bose and Ray-Chaudhuri) code, Reed-Solomon code, self-dual code, Convolutional code, SEC-DED code. James Fiedler, "Hamming Codes," 2004, wholly incorporated by reference as if set forth herein, http://orion.math.iastate.edu/linglong/Math690F04/HammingCodes.pdf, describes the Hamming code in detail. Robert A. Wilson, "The Golay code," QMUL, Pure Mathematics Seminar, January, 2008, wholly incorporated by reference as if set forth herein, describes the Golay code in detail. Sebastian Raaphorst, "Reed-Muller Codes," Carleton University, May, 2003, wholly incorporated by reference as if set forth herein, describes the Reed-Muller code in detail. Hank Wallace, "Error Detection and Correction Using the BCH Code," 2001, Atlantic Quality Design, Inc., http://www.aqdi.com/bch.pdf, wholly incorporated by reference as if set forth herein, describes the BCH code in detail. Jie Gao, "Reed Solomon Code," SUNY Stony Brook, February, 2007, http://www.cs.sunysb.edu/~jgao/CSE370-spring10/reed-solomon-.pdf, wholly incorporated by reference as if set forth herein, describes the Reed Solomon code in detail. J. H. Conway, et al. "Self-Dual Codes over the Integers Modulo 4*," J. Combinational Theory, Series A., Vol. 62, pp. 30-45, 1993, wholly incorporated by reference as if set forth herein, describes the Self-Dual code in detail. Charan Langton, "Tutorial 12 Coding and decoding with Convolutional Codes," July, 1999, www.complextoreal.com, wholly incorporated by reference as if set forth herein, describes the Convolutional code in detail. Ovidiu Novac, et al., "Implementation of a Sec-ded Code with FPGA Xilinx Circuits to the Cache Level of a Memory Hierarchy," 2008, wholly incorporated by reference as if set forth herein, http://electroinf.uoradea.ro/reviste%20CSCS/documente/JCSCS_2008/JCSCS_2008_12_Novac_1.pdf, describes the SEC-DED code in detail.

Traditional systems that use ECC method(s) correct data before processing. In contrast, according to one embodiment, the arbitration logic device 100 processes data (e.g., requestor status information) before correcting the data, and subsequently checks the correctness (e.g., right before outputting a result of arbitration). The arbitration logic device 100 speculatively performs arbitration (i.e., selecting a pending request among a plurality of requests) using uncorrected requestor status information, and cancels it afterward if a corresponding arbitration result is incorrect because of a soft error. The arbitration logic device 100 concurrently checks whether the used requestor status information is correct or not, e.g., based on the ECC method(s) described above, while processing the information for arbitration. Accordingly, based on a result of the checking, the arbitration logic device 100 determines whether the arbitration result obtained from the requestor status information is correct or not. For example, if the requestor status information is determined to be incorrect due to a soft error in it according to the ECC method(s), the corresponding arbitration result is incorrect. Because of the speculative arbitration (i.e., processing the requestor status information while detecting correctness of the information), ECC correction delay does not impact on an arbitration delay. ECC correction delay refers to a certain time required to fix a soft error on the requestor status information. Arbitration delay refers to a certain time to make an arbitration decision in an arbitration logic device. The arbitration logic device 100 requires a small amount of hardware (e.g., only one ECC correction logic device in an entire digital system/circuit) that is necessary to check the correctness of the arbitration result.

In one embodiment, the arbitration logic device 100 does not check correctness of all the requestor status information, i.e., there is no need to have numerous ECC correction logic devices corresponding to numerous ECC words. The arbitration logic device 100 has only one ECC correction logic device to arbitrate pending requests that are included in numerous ECC words.

Thus, this arbitration logic device 100 provides an efficient way to detect and/or correct soft errors with small impact on hardware size, power consumption, and arbitration delay: there is needed only one ECC correction logic device for correcting soft error(s) on a particular ECC word (i.e., a word (64-bit/128-bit data) encoded with ECC); the power consumption is also reduced since only one ECC correction logic device (e.g., an error detection logic device 175 in FIG. 2) is used rather than numerous ECC correction logic devices in a traditional arbitration logic device; the arbitration delay is also reduced because the ECC correction logic device resides outside of the critical path (e.g., a critical path 103 in FIG. 2) of the arbitration logic device 100 and ECC correction logic device is operated concurrently with other modules that generates the arbitration result. This arbitration logic device 100 can be generally available independent of semiconductor design tools, e.g., by designing the logic device 100 through a hardware description language (e.g., VHDL, Verilog, etc.) and implementing the design on a semiconductor device through a semi-custom design or configurable hardware (e.g., Xilinx Virtex, etc.).

The arbitration logic device 100 performs one or more of:
(a) Speculative arbitration with cancellation ability due to a soft error: Instead of correcting requestor status information before processing the requestor status information, the arbitration logic device 100 selects a requestor among a plurality of requestors based on uncorrected requestor state information, e.g., in round-robin fashion, randomly, in first come first served, etc. If the concurrently running ECC correction logic device finds that there was a soft error on the information of the selected requestor, the arbitration logic device 100 cancels the selection, e.g., setting an "invalid" flag bit associated with the selection.
(b) Status information correctness check is performed outside the critical path of the arbitration logic device 100: The arbitration logic device 100 checks whether requestor status information of the selected requestor has a soft error, e.g., by running an ECC method operated in the ECC correction logic device. If that requestor status information has a soft error, the ECC correction logic device sends a signal to the arbitration logic device 100 to cancel the selection. This correctness check is performed outside of the critical path of the arbitration logic device 100. For example, in FIG. 2, the critical path of the arbitration logic device 100 is a path 103 that includes ECC words 120-130, an ECC word selector 155, a final selection logic device (e.g., N-to-1 arbiter 170 in FIG. 2), and a result cancellation logic device 195. As shown in FIG. 2, the error detection logic device 175 resides outside of the critical path 103 of the arbitration logic device 100. The check is also performed only on a subset of all requestors that are selected by the arbitration logic device 100.
(c) Periodic scan and correction on requestor status information: Traditionally, if a requestor has a pending request but a soft error occurs on corresponding requestor status information associated with the requestor and/or pending request, a resulting bit pattern (e.g., a request cancellation signal 190 in FIG. 2) may indicate that the request is invalid (e.g. a request valid flag was originally 1, but it flipped to 0 due to a soft error). As a result, the arbitration logic device 100 ignores the pending request from the requestor. As a result, traditional arbitration devices never select a requestor whose status information has become invalid. Thus, a requestor whose status information has been corrupted due to a soft error is disregarded by the traditional arbitration devices, and thus cannot access shared resources that are controlled by the traditional arbitration devices. To resolve this problem (i.e., being never selected) in traditional arbitration devices, the arbitration logic device 100 scans each of requestors' status information periodically, e.g., in an ascending or descending order. If the arbitration logic device 100 discovers a soft error in requestor status information, the arbitration logic device 100 corrects the soft error, e.g., by using the ECC correction logic device (e.g., error detection logic device 175 in FIG. 2) and writes the corrected requestor status information back to its corresponding storage element (not shown), e.g., registers, flip-flops, latches, etc. The arbitration logic device 100 performs this correction outside the critical path 103 of the arbitration logic device 100.

In one embodiment, requestor status information is encoded by one or more of ECC methods. For example, an ECC word includes 72 bit original data (requestor status information) and 8 bit ECC (e.g., parity bits). The present invention is not limited to any particular ECC encoding scheme.

FIG. 2 illustrates a system diagram of the arbitration logic device 100 in one embodiment. In this embodiment, the arbitration logic device 100 receives, as inputs, "M" number of ECC words (ECC words 120-130), each of which includes status (or state) information of "N" number of requestors 115 and corresponding ECC 110 (e.g., corresponding parity bits). "N" may be selected so that the requestor information of "N" requestors fits in a single ECC word. "N" number of requestors provides the status information of the "N" requestors as shown in FIGS. 1 and 4. The arbitration logic device 100 memorizes requestor status information, e.g., by using storage elements. In one embodiment, each requestor has only 1 bit flag to indicate whether it has a pending request. In another embodiment, each requestor has multiple bits of information to represent some attributes, e.g., when the requestor issued the pending request, how many requests the requestor issued so far, etc. The arbitration logic device 100 stores requestors' status information in the "M" number of ECC words.

The arbitration logic device 100 performs arbitration (i.e., selecting one requestor among M×N requestors) in a winner selection logic device 105 that includes an M-to-1 selector (e.g., ECC word selector logic device 155 in FIG. 2) and an N-to-1 arbiter (e.g., a final selection logic device 170 in FIG. 2). The winner selection logic device 105 including devices 155 and 170 cooperates to selects a winner requestor (e.g., a hardware module in a digital circuit that receives a grant to access a shared resource controlled by the arbitration logic device 100) among requestors that want to access the shared resources based on the requestors' status information. For example, the winner selection logic device 105 selects a requestor which issued a pending request at the earliest time which is recorded in the corresponding requestor status information. The winner selection logic device 105 operates independently and separately from the ECC correction logic device. The winner selection logic device 105 selects the winner requestor regardless of whether there is a soft error in status information of the winner requestor. The winner selection logic device 105 selects the winner requestor without checking whether there is a soft error on the winner requestor status information.

In one embodiment, the winner selection logic device 105 is pipelined into two stages, e.g., the arbitration is performed in two processor clock cycles. In the first stage, the M-to-1 selector (e.g., ECC word selector logic device 155 in FIG. 2) selects one ECC word among the "M" number of ECC words. In one embodiment, the M-to-1 selector is implemented, e.g., by an M-to-1 multiplexer. The M-to-1 selector is controlled by a control logic device 145 that includes an M-to-1 arbiter 135 and a scan and correct logic device 140. In one embodiment, the M-to-1 arbiter 135 makes a decision 150 of which ECC word is selected by the M-to-1 selector (e.g., ECC word selector logic device 155 in FIG. 2) according to a known selection method that includes, but is not limited to: randomly selecting, selecting by seniority (first come first served), selecting in round-robin fashion, etc. The present application is not limited to a particular selection method. Then, the M-to-1 selector 155 forwards the selected ECC word to both the N-to-1 arbiter (e.g., a final selection logic device 170 in FIG. 2) and ECC correction logic device (e.g., an error detection logic device 175 in FIG. 2). In one embodiment, the M-to-1 selector forwards the selected ECC word 165 to ECC correction logic device, and forwards only information of "N" number of requestors 115 included in the selected ECC word after detaching the ECC 110. In the second stage, the N-to-1 arbiter (e.g., a final selection logic device 170 in FIG. 2) receives the selected ECC word that includes information of "N" number of requestors and selects a winner requestor among the "N" number of requestors according to a known selection method that includes, but is not limited to: randomly selecting, selecting by or according to seniority (first come first served), selecting in round-robin fashion, etc. The present application is not limited to a particular selection method. In one embodiment, the N-to-1 arbiter is implemented, e.g., by an N-to-1 multiplexer.

After receiving the selected ECC word that includes status information of the winner requestor to be selected by the N-to-1 arbiter, ECC correction logic device (e.g., an error detection logic device 175 in FIG. 2) checks whether there exists a soft error on the selected ECC word in parallel with the N-to-1 arbiter. In other words, the ECC correction logic device and N-to-1 arbiter operate concurrently. Alternatively, the ECC correction logic device and N-to-1 arbiter may operate sequentially. If the ECC correction logic device detects 185 a soft error on the selected ECC word, e.g., there are an odd number of zeroes though the ECC word is encoded with even parity scheme, the arbitration logic device 100 cancels the arbitration result, i.e., cancels the selection of the winner requestor, and restarts the M-to-1 arbiter and the N-to-1 arbiter. If the soft error is correctable, e.g., only one bit in the selected ECC word is corrupted, the ECC correction logic device corrects the soft error on the selected ECC word according to the encoded ECC method, and then writes back the corrected ECC word 180 into its corresponding storage element.

Table 1 illustrates an exemplary Hamming code. This exemplary Hamming code is obtained from http://www.hackersdelight.org/ecc.pdf, whose whole content is incorporated by reference as if set forth herein.

TABLE 1

Exemplary Hamming code

| Original Data | First parity bit 1 | Second parity bit 2 | Fourth data bit 3 | Third parity bit 4 | Third data bit 5 | Second data bit 6 | First data bit 7 |
| --- | --- | --- | --- | --- | --- | --- | --- |
| $0_{10}$ | $0_2$ | $0_2$ | $0_2$ | $0_2$ | $0_2$ | $0_2$ | $0_2$ |
| $1_{10}$ | $1_2$ | $1_2$ | $0_2$ | $1_2$ | $0_2$ | $0_2$ | $1_2$ |
| $2_{10}$ | $0_2$ | $1_2$ | $0_2$ | $1_2$ | $0_2$ | $1_2$ | $0_2$ |
| $3_{10}$ | $1_2$ | $0_2$ | $0_2$ | $0_2$ | $0_2$ | $1_2$ | $1_2$ |
| $4_{10}$ | $1_2$ | $0_2$ | $0_2$ | $1_2$ | $1_2$ | $0_2$ | $0_2$ |
| $5_{10}$ | $0_2$ | $1_2$ | $0_2$ | $0_2$ | $1_2$ | $0_2$ | $1_2$ |
| $6_{10}$ | $1_2$ | $1_2$ | $0_2$ | $0_2$ | $1_2$ | $1_2$ | $0_2$ |
| $7_{10}$ | $0_2$ | $0_2$ | $0_2$ | $1_2$ | $1_2$ | $1_2$ | $1_2$ |
| $8_{10}$ | $1_2$ | $1_2$ | $1_2$ | $0_2$ | $0_2$ | $0_2$ | $0_2$ |
| $9_{10}$ | $0_2$ | $0_2$ | $1_2$ | $1_2$ | $0_2$ | $0_2$ | $1_2$ |
| $10_{10}$ | $1_2$ | $0_2$ | $1_2$ | $1_2$ | $0_2$ | $1_2$ | $0_2$ |
| $11_{10}$ | $0_2$ | $1_2$ | $1_2$ | $0_2$ | $0_2$ | $1_2$ | $1_2$ |
| $12_{10}$ | $0_2$ | $1_2$ | $1_2$ | $1_2$ | $1_2$ | $0_2$ | $0_2$ |
| $13_{10}$ | $1_2$ | $0_2$ | $1_2$ | $0_2$ | $1_2$ | $0_2$ | $1_2$ |
| $14_{10}$ | $0_2$ | $0_2$ | $1_2$ | $0_2$ | $1_2$ | $1_2$ | $0_2$ |
| $15_{10}$ | $1_2$ | $1_2$ | $1_2$ | $1_2$ | $1_2$ | $1_2$ | $1_2$ |

For example, if the selected ECC word is $1000011_2$ encoded with Hamming code shown in Table 1, this $1000011_2$ represents $3_{10}$. If a soft error occurs in this selected word and thus the selected word becomes $1000111_2$, upon receiving this $1000111_2$, the ECC correction logic device may first count the number of zeroes in $1^{st}$, $3^{rd}$, $5^{th}$, and $7^{th}$ bit positions and determines that there is a soft error in the first parity bit ($1^{st}$ bit position), the fourth data bit ($3^{rd}$ bit position), the third data bit ($5^{th}$ bit position) or the first data bit ($7^{th}$ bit position) since the number of zeroes is odd: (1, 0, 1, 1). Then, the ECC correction logic device counts the number of zeros in $2^{nd}$, $3^{rd}$, $6^{th}$, and $7^{th}$ bit positions and determines that there is no error on the second parity bit ($2^{nd}$ bit position), the fourth data bit ($3^{rd}$ bit position), the second data bit ($6^{th}$ bit position) and the first data bit ($7^{th}$ bit position) since the number of zeros is even: (0, 0, 1, 1). The arbitration logic device 100 counts the number of zeros in $4^{th}$, $5^{th}$, $6^{th}$ and $7^{th}$ bit positions and determines that there is a soft error in third parity bit ($4^{th}$ bit position), the third data bit ($5^{th}$ bit position), the second data bit ($6^{th}$ bit position) or the first data bit ($7^{th}$ bit position) since the number of zeros odd: (0, 1, 1, 1). According to the first counting (i.e., counting the number of zeroes in $1^{st}$, $3^{rd}$, $5^{th}$, and $7^{th}$ bit positions) and the second counting (i.e., counting the number of zeroes in $2^{nd}$, $3^{rd}$, $6^{th}$, and $7^{th}$ bit positions), the first parity bit or the third data bit has the soft error. According to the third counting (i.e., counting the number of zeroes in $4^{th}$, $5^{th}$, $6^{th}$ and $7^{th}$ bit positions) and the second counting, it is determined in this example that the third data bit or the third parity bit has soft error. In other words, a first analysis based on the first counting and second counting concludes that the first parity bit or the third data bit has the soft error. A second analysis based on the second counting and the third counting concludes that the third data bit or the third parity bit has soft error. A common factor between the two analyses is the third data bit ($5^{th}$ bit position). Thus, the ECC correction logic device detects the soft error on the third data bit and fixes the error, e.g., by converting "1" in the third data bit to "0".

If the ECC correction logic device (e.g., the error detection logic 175 in FIG. 1) detects a soft error in the selected ECC word 165, the ECC correction logic device sends a cancellation signal 190 (e.g., '0' bit(s)) to a result cancellation logic device 195. The result cancellation logic device 195 cancels the selection of the winner requestor upon receiving the cancellation signal 190. In one embodiment, the result cancellation logic device 195 is implemented as an AND gate. For example, after the N-to-1 arbiter chooses the winner requestor, the N-to-1 arbiter sets a request grant flag bit 193 associated with the winner requestor. The result cancellation logic device 195 performs a logical AND operation on the request grant flag bit 193 and a logical NOT operation of the cancellation signal 190. Thus, if there is a soft error on the selected ECC word that includes the winner requestor status information, the set request grant flag bit 193 is de-asserted, i.e., the selection of the winner requestor is void. The arbitration logic device 100 does not grant access permission to any requestors (including the winner requestor) and waits the ECC correction logic device fixes the soft error if the soft error is correctable error, e.g., a single bit error within the selected ECC word. If the soft error is correctable, after ECC correction logic device fixes the soft error on the selected ECC word and writes back the corrected ECC word to its corresponding storage element(s), the arbitration logic device performs again the arbitration. For example, a single bit error within an ECC word can be corrected as described above. However, a double bit error within an ECC word may be detected but not corrected. If there is no soft error on the selected ECC word, the arbitration logic device 100 grants the access permission 197 to the winner requestor. As shown in FIG. 1, the access permission 197 is used as a selection signal (e.g., a signal 30 in FIG. 1) to allow the winner requestor to access the shared resource 50. If the soft error is uncorrectable, the ECC correction logic device stops the arbitration logic device 100, e.g., by setting a critical error flag bit (not shown).

The control logic device 145 includes the scan and correct logic device 140 as well as the M-to-1 arbiter 135. The scan-correct logic periodically reads each ECC word and corrects it if a soft error is detected. The scan and correct logic device 145 periodically reads requestors' status information stored in storage element(s), checks whether there is a soft error in the requestors' information, and corrects the soft error in the requestors' information, e.g., by using ECC correction logic device and the M-to-1 selector. Specifically, the scan and correct logic device 145 drives a select line 150 of the M-to-1 selector to select a desired ECC word (e.g., ECC word 1 120, ECC word 2 125, . . . , or ECC word M 130 in FIG. 2). Then, the ECC correction logic device checks whether the selected ECC word has a soft error. If the ECC correction logic device detects a soft error on the selected ECC word according to an ECC method adopted in a digital circuit where the arbitration logic device 100 is implemented and/or used, the ECC correction logic device corrects the soft error on the selected ECC word (if correctable) and writes back the corrected ECC word to its corresponding storage element. Since the scan and correct logic device 140 uses the M-to-1 selector and the ECC correction logic device, it operates only when the N-to-1 arbiter is idle. The scan and correct logic device 140 may operate when the winner selection logic device 105 is idle. There can be many possible ways to decide a priority between the N-to-1 arbiter and the scan and correct logic device 140. There can be many choices to decide a frequency of reading each ECC word and an order (e.g., a cyclic order) to read each ECC word. The frequency is trade-off between power consumption and recovery time from a soft error. By scanning frequently, the arbitration logic device 100 can quickly find and recover from soft errors at the cost of power consumption. If the arbitration logic device 100 finds that there is no pending request (e.g., no ECC word inputs), it can stop scan and correct logic device 140 to save power.

Figure 3:
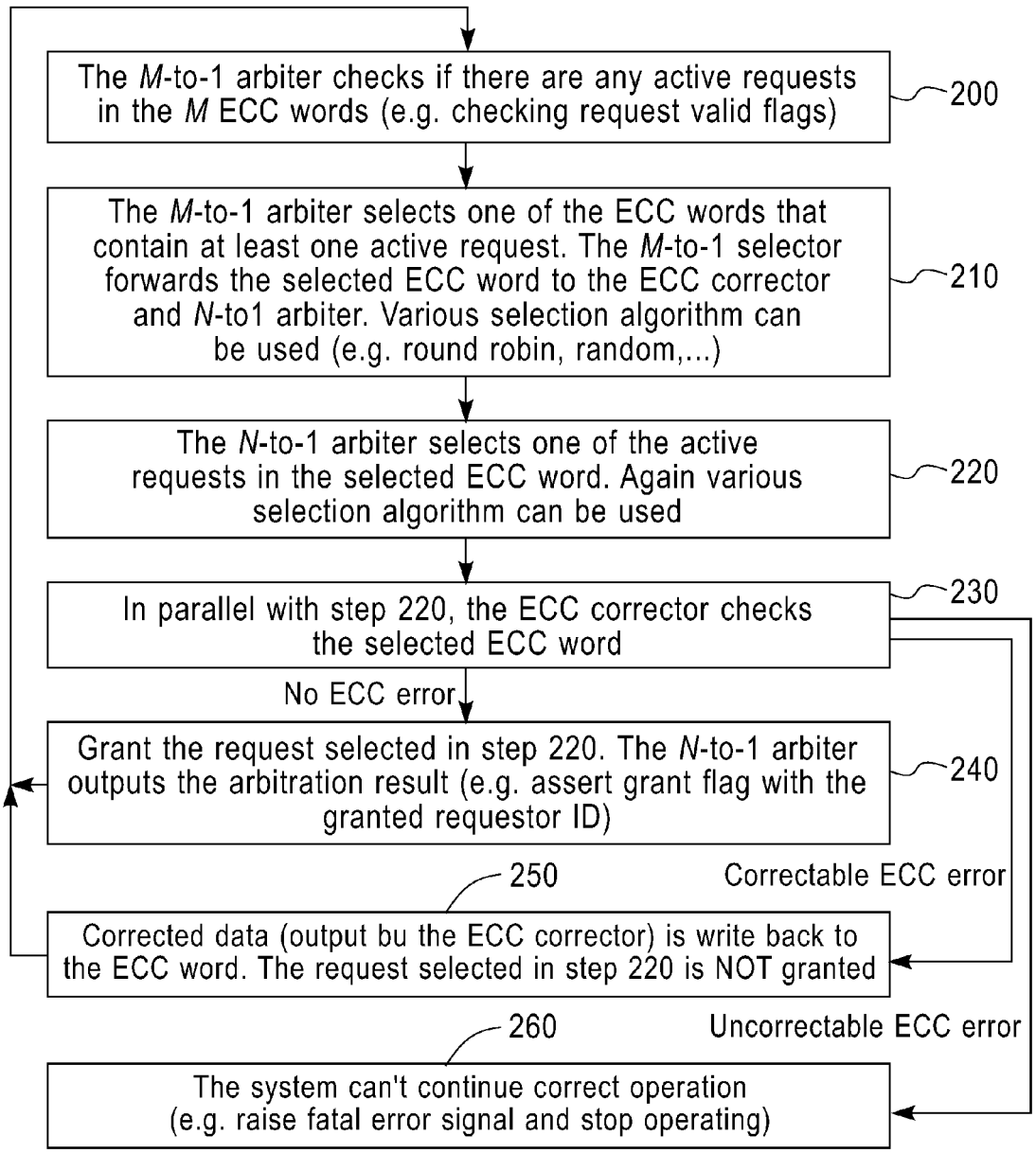
FIG. 3 is a flow chart illustrating method steps for operating an arbitration logic device in a digital circuit/system according to one embodiment.

FIG. 3 illustrates a flow chart that describes method steps for operating the arbitration logic device 100 in one embodiment. At step 200, after the arbitration logic device 100 receives ECC words 120-130 as inputs, the M-to-1 arbiter 135 checks whether there is any pending request in the "M" number of ECC words 120-130, e.g., by checking a request valid flag bit(s) in each ECC word. At step 210, the M-to-1 arbiter 135 selects 150 one of the ECC words that includes at least one pending request according to a known selection method (e.g., round-robin, randomly, first come first served, etc.). The M-to-1 selector (e.g., ECC word selector logic 155 in FIG. 2) forwards the selected ECC word to the ECC correction logic device (e.g., error detection logic device 175 in FIG. 2) and the N-to-1 arbiter (e.g., final selection logic device 170 in FIG. 2).

At step 220, the N-to-1 arbiter selects one of the pending requests in the selected ECC word according to a known selection method (e.g., round-robin, randomly, first come first served, etc.). At step 230, while the N-to-1 arbiter selects one of the pending requests in the selected ECC word, the ECC correction logic device simultaneously detects whether the selected ECC word includes a soft error according to an ECC method adopted by the arbitration logic device 100.

If there is no soft error detected in the selected ECC word, at step 240, the arbitration logic device 100 grants the request (e.g., access permission to a shared resource controlled by the arbitration logic device 100). Specifically, the N-to-1 arbiter outputs the arbitration result 197 (the selection of the winner requestor), e.g., by asserting the request grant flag bit 193 with the winner requestor ID for enabling the winner requestor's access to the shared resource 50. Then, the control returns to the step 200.

If there is a soft error on the selected ECC word, at step 250, the ECC correction logic device evaluates whether the soft error is correctable or not. Thus, if the soft error is correctable, e.g., a single bit error within the selected ECC word, the ECC correction logic device corrects the soft error on the selected ECC word and writes back the corrected ECC word into its corresponding storage elements. While correcting the soft error, the ECC correction logic device sends the cancellation signal 190 to void the request selected at step 220. The arbitration logic device does not grant access permission to the shared resource to any requestor (including the winner requestor). Then, the control returns to step 200 to redo the selection process (i.e., selecting a pending request among a plurality of pending requests).

Otherwise, if there is a detected soft error on the selected ECC word but the soft error is uncorrectable (e.g., double bit error within the selected ECC word), at step 260, the ECC correction logic device does not attempt to fix the error and stops the operation of the arbitration logic device 100, e.g., by setting a critical error flag bit.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with a system, apparatus, or device running an instruction.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with a system, apparatus, or device running an instruction.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may run entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which run via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which run on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more operable instructions for implementing the specified logical function(s). It should also be noted that, in some alternative implementations, the functions noted in the block may occur out of the order noted in the figures. For example, two blocks shown in succession may, in fact, be run substantially concurrently, or the blocks may sometimes be run in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. An arbitration logic device for controlling an access to a shared resource, the arbitration logic device comprising:
   a selection logic device for receiving a plurality of ECC (Error Correction Code) words, each ECC word including a first plurality of bits representing a plurality of requestors, a second plurality of bits indicating whether each requestor is requesting to access to the shared resource, and an ECC code corresponding to the first plurality of bits and the second plurality of bits;

the selection logic device for selecting one ECC word among the plurality of ECC words without checking whether there exists a soft error in the selected ECC word;

an error detection logic device for detecting a soft error in the selected ECC word after the selection of the selected ECC word;

a first logic device for receiving the selected ECC word and selecting, based on the selected ECC word, a winner requestor among the plurality of requestors; and a logic gate for invalidating the selection of the winner requestor if the error detection logic device detects a soft error in the selected ECC word, wherein the error detection logic device and the first logic device run concurrently.

2. The arbitration logic device according to claim 1, wherein the error detection logic device resides outside of a critical path in the arbitration logic device.

3. The arbitration logic device according to claim 1, wherein requestors' information is encoded with the error correcting code (ECC) that includes one or more of: Hamming code, Golay code, Reed-Muller code, BCH (Bose and Ray-Chaudhuri) code, Reed-Solomon code, self-dual code, convolutional code, SEC-DED code, the error detection logic device detecting and correcting the soft error based on the error correcting code (ECC).

4. The arbitration logic device according to claim 1, wherein the error detection logic device detects and corrects a soft error only on the selected ECC word.

5. The arbitration logic device according to claim 1, further comprising:

a storage element for storing the plurality of ECC words;

a scan and correct logic device for periodically reading ECC words stored in the storage element, checking whether there is a soft error in the ECC words, and correcting the soft error in the ECC words by using the error detection logic device and the selection logic device.

6. The arbitration logic device according to claim 5, wherein the scan and correct logic operates only when the selection logic device is idle.

7. A method for operating an arbitration logic device that controls a shared resource, the method comprising:

receiving a plurality of ECC (Error Correction Code) words, each ECC word including a first plurality of bits representing a plurality of requestors, a second plurality of bits indicating whether each requestor is requesting to access to the shared resource, and an ECC code corresponding to the first plurality of bits and the second plurality of bits;

selecting one ECC word among the plurality of ECC words without checking whether there exists a soft error in the selected ECC word;

detecting a soft error in the selected ECC word after the selection of the selected ECC word;

receiving the selected ECC word and selecting, based on the selected ECC word, a winner requestor among the plurality of requestors; and invalidating the selection of the winner requestor if the error detection logic device detects a soft error in the selected ECC word, wherein the detecting of the soft error in the selected ECC word and the selecting the winner requestor are performed concurrently.

8. The method according to claim 7, wherein the error detection logic device resides outside of a critical path in the arbitration logic device.

9. The method according to claim 7, wherein requestors' information is encoded with the error correcting code (ECC) that includes one or more of: Hamming code, Golay code, Reed-Muller code, BCH (Bose and Ray-Chaudhuri) code, Reed-Solomon code, self-dual code, convolutional code, SEC-DED code, the error detection logic device detecting and correcting the soft error based on the error correcting code (ECC).

10. The method according to claim 7, wherein the error detection logic device detects and corrects a soft error only on the selected ECC word.

11. The method according to claim 7, further comprising:

storing the plurality of ECC words;

periodically reading the ECC words, checking whether there is a soft error in the requestors' information, and correcting the soft error in the ECC words by the detecting the soft error and the choosing one of the ECC words.

12. The method according to claim 11, wherein the reading, the checking and the correcting are performed when the selecting the winner requestor is not performed.

13. A computer program product for operating an arbitration logic device that controls an access to a shared resource, the computer program product comprising a non-transitory storage medium readable by a processing circuit and storing instructions run by the processing circuit for performing a method, the method comprising:

receiving a plurality of ECC (Error Correction Code) words, each ECC word including a first plurality of bits representing a plurality of requestors, a second plurality of bits indicating whether each requestor is requesting to access to the shared resource, and an ECC code corresponding to the first plurality of bits and the second plurality of bits;

selecting one ECC word among the plurality of ECC words without checking whether there exists a soft error in the selected ECC word;

detecting a soft error in the selected ECC word after the selection of the selected ECC word;

receiving the selected ECC word and selecting, based on the selected ECC word, a winner requestor among the plurality of requestors; and invalidating the selection of the winner requestor if the error detection logic device detects a soft error in the selected ECC word, wherein the detecting of the soft error in the selected ECC word and the selecting the winner requestor are performed concurrently.

14. The computer program product according to claim 13, wherein the error detection logic device resides outside of a critical path in the arbitration logic device.

* * * * *